United States Patent
Wu et al.

[11] Patent Number: 6,030,892
[45] Date of Patent: Feb. 29, 2000

[54] METHOD OF PREVENTING OVERPOLISHING IN A CHEMICAL-MECHANICAL POLISHING OPERATION

[75] Inventors: Kun-Lin Wu, Tai Chung; Hao-Kuang Chiu, Taipei; Horng-Bor Lu; Jenn-Tarng Lin, both of Hsinchu, all of Taiwan

[73] Assignee: United Microelectronics Corp., Taiwan

[21] Appl. No.: 08/866,131

[22] Filed: May 30, 1997

[30] Foreign Application Priority Data

Apr. 7, 1997 [TW] Taiwan ................... 86104369

[51] Int. Cl.[7] .............................. H01L 21/4763
[52] U.S. Cl. ............................................. 438/633
[58] Field of Search .............................. 438/633

[56] References Cited

PUBLICATIONS

Wolf, S. Silicon Processing for the VLSI Era, vol. II, Lattice Press, pp. 229–232, 1990.

*Primary Examiner*—John F. Niebling
*Assistant Examiner*—Josetta I. Jones
*Attorney, Agent, or Firm*—Rabin & Champagne, PC

[57] ABSTRACT

A method of preventing overpolishing in a chemical-mechanical polishing operation includes using a spin-on polymer material instead of spin-on glass as the local planarization material. The spin-on polymer layer is further used as a polishing stop layer so as to prevent damage to components due to overpolishing, because the polishing rate of the spin-on polymer layer in a chemical-mechanical polishing operation is, in general, lower than the polishing rate of the silicon dioxide layer formed using plasma enhanced chemical vapor deposition.

20 Claims, 2 Drawing Sheets

METHOD OF PREVENTING OVERPOLISHING IN A CHEMICAL-MECHANICAL POLISHING OPERATION

BACKGROUND OF THE INVENTION

1. Field of Invention

This invention relates in general to a method of preventing overpolishing in a chemical-mechanical polishing operation. More specifically, the present invention relates to using a spin-on polymer material instead of a spin-on glass (SOG) material to prevent overpolishing in chemical-mechanical polishing operations.

2. Description of Related Art

Chemical-mechanical polishing is a universal technique which provides for global planarization of wafers in the semiconductor industry. The technique has gone through decades of improvements and is now successfully applied to all kinds of semiconductor products, such as microprocessors and memories.

A conventional planarization method is shown in FIGS. 1A and 1B. First, and referring to FIG. 1A, a planar surface 10, for example, a silicon substrate or an insulating layer having a pattern defined on a conducting layer 11 thereabove, is provided. The conducting layer 11 can be, for example, a polysilicon layer or a metallic layer. Then, an oxide layer 12 is formed above the surface of the conducting layer 11 using, for example, a plasma enhanced chemical vapor deposition (PECVD) method to form, for example, a silicon dioxide layer. Next, a spin-on glass layer 13 (for example, a kind of acidic silicon salt) is formed over the surface of the oxide layer 12. Thereafter, an oxide layer 14 is formed over the surface of the spin-on glass layer 13 using, for example, a plasma enhanced chemical vapor deposition method to form, for example, a silicon dioxide layer.

Referring next to FIG. 1B, a chemical-mechanical polishing operation is required oxide thickness level. In general, for a silicon dioxide layer formed using a plasma enhanced chemical vapor deposition method, the polishing rem oval rate is about 1500 Å to about 6000 Å/minute using a chemical-mechanical polishing operation. In contrast, the acidic silicon salt type of spin-on glass has a polishing removal rate of about 3000 Å to about 6000 Å/minute. When spin-on glass is used, only local planarization is obtained. This is because when a chemical-mechanical polishing operation is in progress, the spin-on glass layer 13 is reached after grinding away the full thickness of the oxide layer 14, because the oxide layer 14 just above the conducting layer 11 is thinner. As a result of the different polishing removal rate between the spin-on glass layer 13 and the oxide layer, the spin-on glass layer 13 and the oxide layer 12 above the conducting layer 11 will be completely removed with perhaps subsequent further grinding away of part of the top of the con ducting layer 11, causing damages to the components.

SUMMARY OF THE INVENTION

It is therefore an object of this invention to provide a method of preventing overpolishing in a chemical-mechanical polishing operation by using a spin-on polymer material instead of spin-on glass. The chemical-mechanical polishing rate for a spin-on polymer layer is lower and therefore capable of preventing overpolishing.

Another object of this invention is to provide a method of preventing overpolishing in a chemical-mechanical polishing operations by using a spin-on polymer layer as a polishing s top layer.

Th e method of preventing overpolishing in a chemical-mechanical polishing operation according to this invention includes providing a planar surface having a defined and patterned conducting layer thereabove. A first oxide layer is formed over the planar surface and over a surface of the con ducting layer. A spin-on polymer layer is formed over a surface of the first oxide layer. A second oxide layer is formed over a surface of the spin-on polymer layer. The second oxide layer has a higher polishing removal rate than the spin-on polymer layer. The second oxide layer is chemical-mechanical polished to a certain thickness, and the spin-on polymer layer is utilized as a polishing stop to prevent a removal of the conducting layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
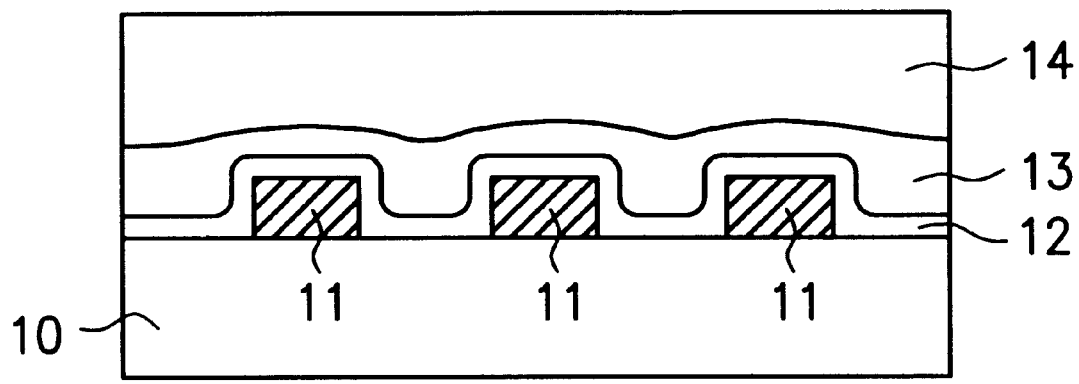
FIGS. 1A and 1B show a conventional method of planarization using a chemical-mechanical polishing operation.
Figure 1B:
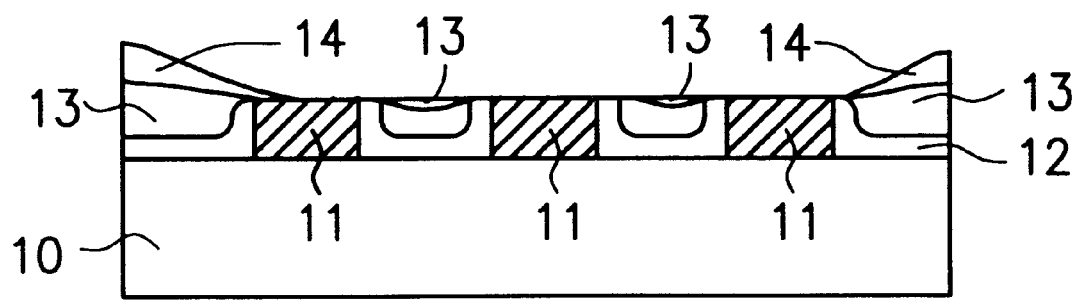
Figure 2A:
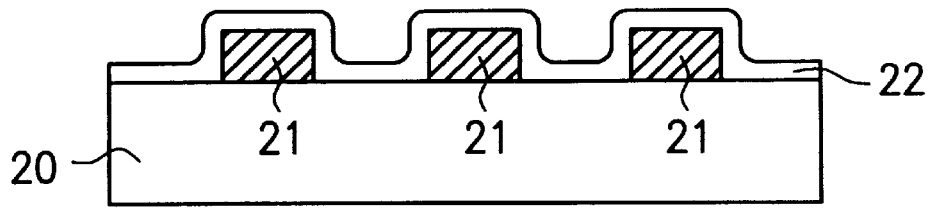
FIGS. 2A through 2C show a method of preventing overpolishing during a chemical-mechanical polishing operation according to one preferred embodiment of this invention.
Figure 2B:
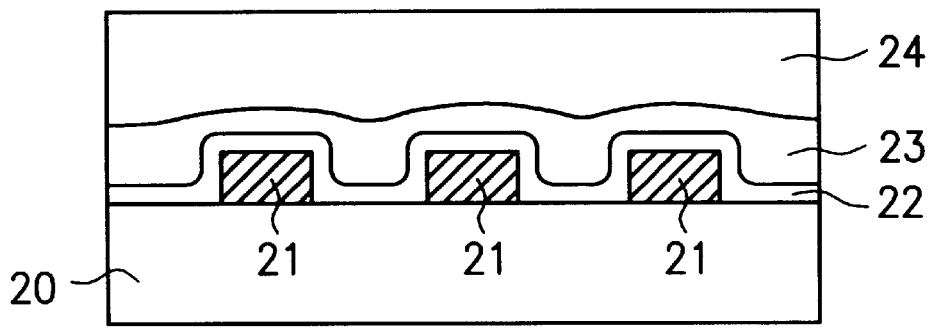
Figure 2C:
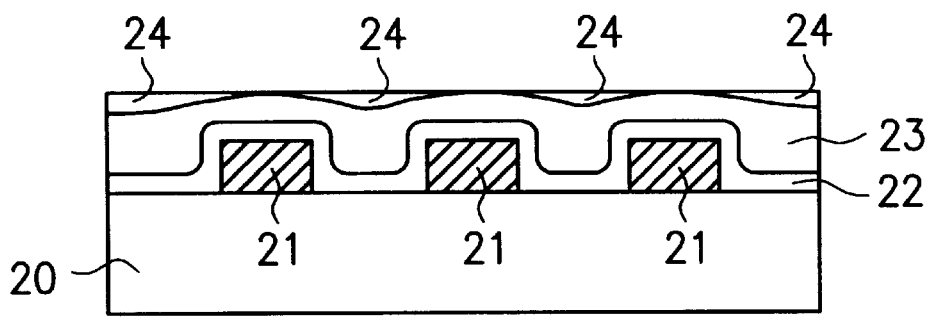

FIGS. 2A through 2C show a method for preventing overpolishing in a chemical-mechanical polishing operation according to one preferred embodiment of this invention.

First, referring to FIG. 2A, a planar surface 20, for example, a substrate or an insulating layer, having MOS components formed thereabove, and including at least a patterned conducting layer 21, is provided. The conducting layer 21 can be, for example, a polysilicon layer or a metallic layer. Then, an oxide layer 22 is formed over the planar surface 20 and the surface of the conducting layer 21 using, for example, a chemical vapor deposition method to form, for example, a silicon dioxide layer.

Thereafter, and referring to FIG. 2B, local planarization is performed using a siloxane material containing functional groups such as a methyl group to form a spin-on polymer layer 23 over the surface of the oxide layer 22. The spin-on polymer layer 23 is comprised of, for example, $CH_3SiO_x$, (i.e. a siloxane material) where x is approximately between 1 to 2, and the hardening temperature of the spin-on polymer layer 23 is about 400–500° C.

Next, an oxide layer 24 is formed over the spin-on polymer layer 23 using, for example, a plasma enhanced chemical vapor deposition method to form, for example, a silicon dioxide layer.

Finally, referring to FIG. 2C, a wafer polishing procedure is performed using chemical-mechanical polishing to obtain a planar oxide layer having the desired thickness. The oxide layer 24 has a chemical-mechanical polishing removal rate of about 1500 to about 6000 Å/minute, while the spin-on polymer layer 23 (comprised of $CH_3SiO_x$) has a chemical-mechanical polishing removal rate of about 200 to about 1000 Å/minute. Therefore, when undergoing a chemical-mechanical polishing operation, the material removal rate upon reaching the spin-on polymer layer 23 will be significantly lowered, and the conducting layer 21 directly underneath the spin-on polymer layer 23 will not be rapidly removed, which is quite dissimilar to the spin-on glass layer used in the conventional method that can cause serious component damage. In the preferred embodiment of this invention, the spin-on polymer layer 23 can also be used as a polishing stop layer in a chemical-mechanical polishing operation to protecting the conducting layer 21 therebelow from being damaged.

While the invention has been described by way of example and in terms of a preferred embodiment, it is to be understood that the invention is not limited to the disclosed embodiment. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of preventing over polishing in a chemical-mechanical polishing operation, comprising:

providing a planar surface having a defined and patterned conducting layer thereabove;

forming a first oxide layer over the planar surface and over a surface of the conducting layer;

forming a spin-on polymer layer composed from $CH_3SiO_x$, wherein x is in the range between 1 and 2, over a surface of the first oxide layer;

forming a second oxide layer over a surface of the spin-on polymer layer, the second oxide layer having a higher polishing removal rate than the spin-on polymer layer; and chemical-mechanical polishing the second oxide layer to a certain thickness, and utilizing the spin-on polymer layer as a polishing stop to prevent a removal of the conducting layer.

2. The method according to claim 1, wherein said providing a planar surface includes providing a silicon substrate having the planar surface.

3. The method according to claim 1, wherein said providing a planar surface includes providing an insulating layer having the planar surface.

4. The method according to claim 1, wherein said providing a planar surface includes providing the planar surface with a polysilicon conducting layer thereabove.

5. The method according to claim 1, wherein said providing a planar surface includes providing the planar surface with a metallic conducting layer thereabove.

6. The method according to claim 1, wherein said forming a first oxide layer includes forming the first oxide layer of a silicon dioxide layer using chemical vapor deposition.

7. The method according to claim 1, wherein said forming a second oxide layer includes forming the second oxide layer of silicon dioxide using plasma enhanced chemical vapor deposition.

8. The method according to claim 1, wherein the spin-on polymer layer has a polishing removal rate between about 200 Å/minute and about 1000 Å/minute.

9. The method according to claim 1, wherein the second oxide layer has a polishing removal rate between about 1500 Å/minute and about 6000 Å/minute.

10. The method according to claim 1, wherein said providing a planar surface includes providing the planar surface with at least one metallic-oxide-semiconductor component thereon.

11. A method of preventing over polishing in a chemical-mechanical polishing operation, comprising:

providing a planar surface having a defined and patterned conducting layer thereabove;

forming a first oxide layer over the planar surface and over a surface of the conducting layer;

forming a spin-on polymer layer composed from a siloxane material over a surface of the first oxide layer;

forming a second oxide layer over a surface of the spin-on polymer layer, the second oxide layer having a higher polishing removal rate than that of the spin-on polymer layer; and chemical-mechanical polishing the second oxide layer to a certain thickness, and utilizing the spin-on polymer layer as a polishing stop to prevent a removal of the conducting layer.

12. The method according to claim 11, wherein said providing a planar surface includes providing a silicon substrate having the planar surface.

13. The method according to claim 11, wherein said providing a planar surface includes providing an insulating layer having the planar surface.

14. The method according to claim 11, wherein said providing a planar surface includes providing the planar surface with a polysilicon conducting layer thereabove.

15. The method according to claim 11, wherein said providing a planar surface includes providing the planar surface with a metallic conducting layer thereabove.

16. The method according to claim 11, wherein said forming a first oxide layer includes forming the first oxide layer of a silicon dioxide layer using chemical vapor deposition.

17. The method according to claim 11, wherein said forming a second oxide layer includes forming the second oxide layer of silicon dioxide using plasma enhanced chemical vapor deposition.

18. The method according to claim 11, wherein the spin-on polymer layer has a polishing removal rate between about 200 Å/minute and about 1000 Å/minute.

19. The method according to claim 11, wherein the second oxide layer has a polishing removal rate between about 1500 Å/minute and about 6000 Å/minute.

20. The method according to claim 11, wherein said providing a planar surface includes providing the planar surface with at least one metallic-oxide-semiconductor component thereon.

* * * * *